United States Patent
Entringer et al.

(10) Patent No.: US 9,194,703 B2
(45) Date of Patent: Nov. 24, 2015

(54) ELECTRONIC DRIVE CIRCUIT FOR A MEMS TYPE RESONATOR DEVICE AND METHOD FOR ACTUATING THE SAME

(71) Applicant: EM Microelectronic-Marin SA, Marin (CH)

(72) Inventors: Christophe Entringer, Corcelles-pres-Concise (CH); Alexandre Deschildre, Marin (CH)

(73) Assignee: EM Microelctronic-Marin SA, Marin (CH)

( * ) Notice: Subject to any disclaimer, the term of this patent is extended or adjusted under 35 U.S.C. 154(b) by 0 days.

(21) Appl. No.: 14/242,992

(22) Filed: Apr. 2, 2014

(65) Prior Publication Data
US 2014/0305207 A1   Oct. 16, 2014

(30) Foreign Application Priority Data

Apr. 10, 2013 (EP) ..................................... 13163181

(51) Int. Cl.
*H03B 5/30* (2006.01)
*G01C 19/5712* (2012.01)
*G01C 19/5776* (2012.01)

(52) U.S. Cl.
CPC ........ *G01C 19/5712* (2013.01); *G01C 19/5776* (2013.01); *H03B 5/30* (2013.01)

(58) Field of Classification Search
CPC ...... H03B 5/04; H03B 5/1215; H03B 5/1228; H03B 5/124; H03B 5/30; H03B 5/366; H03H 11/1291; H03H 2210/021; H03H 2210/043; H03L 5/00; G01L 1/255; G01C 21/26; G01C 22/00; G01C 19/56; G01C 3/08; G01C 19/5712; G01C 19/5719; G01C 19/5726; G01C 19/5776
USPC .......................................... 331/154, 96, 116 M
See application file for complete search history.

(56) References Cited

U.S. PATENT DOCUMENTS

2010/0149721 A1   6/2010   Prandi
2011/0005315 A1   1/2011   Chen et al.
(Continued)

FOREIGN PATENT DOCUMENTS

EP   2 259 019 A1   12/2010
EP   2 336 717 A1   6/2011

OTHER PUBLICATIONS

European Search Report issued Oct. 7, 2013, in Patent Application No. EP 13 16 3181, filed Apr. 10, 2013 (with English-language translation).
Xu Wang, et al., "Force to Rebalance Control of HRG and Suppression of Its Errors on the Basis of FPGA", Sensors, vol. 11, 2011, pp. 11761-11773.

(Continued)

*Primary Examiner* — Arnold Kinkead
(74) *Attorney, Agent, or Firm* — Oblon, McClelland, Maier & Neustadt, L.L.P.

(57) ABSTRACT

An electronic circuit for driving a resonator of a MEMS-type resonator device is provided. The resonator includes a mass connected to a spring and a damping element, an actuation element for actuating the mass via an actuation signal, and a detection element for detecting motion of the mass. The electronic circuit includes a conversion means connected to the detection element to supply a mass oscillation derivative signal, a means of comparing the derivative signal amplitude and a reference amplitude for supplying a control signal, and a decision unit for supplying a digital actuation signal. The actuation signal includes rectangular pulses determined on the basis of the derivative signal and of the control signal to adapt the mass oscillation amplitude according to the reference amplitude.

15 Claims, 2 Drawing Sheets

(56) References Cited

U.S. PATENT DOCUMENTS

2011/0197675 A1   8/2011   Caminada et al.
2011/0285445 A1*  11/2011  Huang et al. .................. 327/306
2013/0170091 A1   7/2013   Prandi

OTHER PUBLICATIONS

Mikko Saukoski, "System and Circuit Design for a Capacitive MEMS Gyroscope", Helsinki University of Technology, Faculty of Electronics, Communications and Automation, Department of Micro and Nanosciences, 2008, 270 pages.

* cited by examiner

ELECTRONIC DRIVE CIRCUIT FOR A MEMS TYPE RESONATOR DEVICE AND METHOD FOR ACTUATING THE SAME

This application claims priority from European Patent Application No. 13163181.4 filed Apr. 10, 2013, the entire disclosure of which is incorporated herein by reference.

FIELD OF THE INVENTION

The present invention concerns an electronic drive circuit for a MEMS type resonator device, and in particular for a MEMS type gyroscope with a high quality factor.

The present invention also concerns the method for actuating the electronic drive circuit for the MEMS type resonator device.

BACKGROUND OF THE INVENTION

Conventionally, an electronic circuit connected to a resonator of a MEMS type resonator device can also be used to perform an angular velocity measurement. An angular velocity may be measured on one, two or three axes, for example with a MEMS type gyroscope. The gyroscope generally includes at least one mass maintained by a structure in the form of a spring and capable of being set in oscillation electrically at a frequency determined by the spring constant with a defined damping factor for the mass. An angular velocity can be determined on the basis of the oscillation velocity of the mass and the force generated, which is perpendicular to the angular velocity and to the oscillation motion of the mass.

To achieve this, there exist electronic drive circuits, which preferably use oscillation in a phase lock loop to drive oscillation along at least one axis of motion of the MEMS resonator as described, in particular, in EP Patent Application Nos 2 259 019 A1 and 2 336 717 A1. The use of a phase lock loop for maintaining the oscillation of the resonator mass does not reduce the general power consumption of the system for controlling the oscillation phase and amplitude, which is a drawback. Account must also be taken of a relatively high supply voltage for maintaining the oscillation of said mass, which does not allow the start time of the gyroscope drive circuit to be reduced, which are further drawbacks.

The electronic drive circuit of a MEMS gyroscope resonator on one, two or three axes may also be cited, which is disclosed in the thesis entitled "System and circuit design for a capacitive MEMS gyroscope" by Mikko Saukoski of Helsinki University of Technology, Faculty of Electronics, Communication and Automation, Department of Micro and Nano Sciences dated 2008 (ISBN9789512292974). As previously, a phase lock loop is used for maintaining the oscillation of the mass of the primary resonator of the gyroscope, as shown in FIG. 2.9 of page 31. The rotational velocity measurement is determined by the secondary resonator of the gyroscope in a direction perpendicular to the motion of the oscillating mass. This does not reduce the electrical power consumption of the system, which is a drawback. Several disruptions are also noted between actuation of the mass oscillation and detection of the mass motion for regulating the oscillation amplitude, which is another drawback.

The document entitled "Force to rebalance control of HRG and suppression of its errors on the basis of FPGA" by Xu Wang, Wenqi Wu, Bing Luo, Zhen Fang, Yun Li and Qingan Jiang, published on 16 Dec. 2011 in Sensors 2011 (ISSN 1424-8220), may also be cited. This document discloses a new concept of adapting force for a hemisphere gyroscopic resonator on the basis of an FPGA. The system disclosed provides for forced oscillation of the mass by a VCO oscillator on the basis of $\cos(\omega \cdot t)$ and $\sin(\omega \cdot t)$ signals. The system detects the motion of the secondary resonator, which is defined as the south electrode for powering the primary resonator, which is defined as the west electrode. This therefore cancels out vibration on the primary. In this control loop, phase and amplitude are controlled to supply exactly the power necessary to cancel out the motion of the secondary.

One drawback of this system is that it uses a VCO oscillator. This makes it impossible to reduce the general electrical power consumption of the system for controlling oscillation phase and amplitude. Further, the information from the secondary is used to oscillate the primary resonator. This complicates manufacture, and also the precision of the oscillation phase and amplitude control. The primary is dependent on the secondary, which is another drawback.

SUMMARY OF THE INVENTION

It is therefore an object of the invention to overcome the drawbacks of the aforementioned state of the art by providing an electronic drive circuit for a MEMS type resonator device, which is not complex and can minimise electrical power consumption while reducing the start time of the electronic circuit for maintaining the oscillation of the resonator.

The invention therefore concerns an electronic drive circuit for a MEMS type resonator device, the electronic drive circuit being connected to at least one resonator of the resonator device, the resonator including a mass connected to a structure of the device by a spring and a damping element, an actuation element for setting the mass in motion in one direction on the basis of an actuation signal, which is supplied by the electronic circuit, and a detection element for detecting the motion of the mass processed in the electronic circuit to adapt at least one oscillation amplitude level of the moving mass, wherein the electronic drive circuit includes a conversion means connected to the detection element to supply a derivative signal relating to the oscillation of the moving mass, a comparison means for comparing an amplitude level of the derivative signal and a defined reference amplitude for supplying an amplitude level control signal, and a decision unit, which is connected to the conversion means and to the comparison means, and which is configured to supply an actuation signal in digital form to the actuation element, said actuation signal being formed of a series of rectangular pulses arranged and determined on the basis of the derivative signal and of the control signal to increase or decrease or maintain the oscillation amplitude of the moving mass as a function of the defined reference amplitude.

Specific embodiments of the electronic drive circuit for a MEMS type resonator device are defined in the dependent claims 2 to 12.

One advantage of the electronic drive circuit for a MEMS type resonator device lies in the fact that the energy transmitted to the primary resonator of the device is maximised, which avoids the use of a high supply voltage. The electronic drive circuit is also less complex than any state of the art electronic circuit for performing the same functions of maintaining the oscillation of the mass at a determined oscillation amplitude.

Advantageously, the starting time of the electronic circuit for setting the primary resonator of the device in oscillation is greatly reduced. In this regard, a drive generator may generate an actuation start signal, which does not need to be totally synchronised with the natural frequency of the spring connected to the oscillating mass. A simple RC oscillator, which is easy to make with a limited number of electronic components, may thus easily be used as the initial drive generator.

This type of electronic drive circuit for the primary resonator may be integrated into a reduced integration surface. Further, the excitation diagram of the electronic circuit is also greatly simplified.

The invention therefore also concerns a method for actuating an electronic drive circuit of the MEMS type resonator device, wherein the method includes the steps of:
- detecting motion of the oscillating mass and supplying a derivative signal via a current-voltage converter connected to the detection element of the resonator,
- comparing the amplitude level of the derivative signal relative to a reference amplitude to supply an amplitude level control signal,
- controlling the decision unit, which is a logic unit, to supply the actuation signal in digital form to the actuation element, wherein said actuation signal comprises a series of rectangular pulses arranged and determined on the basis of the derivative signal and of the control signal to increase or decrease or maintain the oscillation amplitude of the moving mass as a function of the defined reference amplitude, and
- repeating the preceding steps in the electronic circuit, until the oscillation amplitude of the moving mass is adapted as a function of the defined reference amplitude.

One particular step of the method is defined in the dependent claim 14.

BRIEF DESCRIPTION OF THE DRAWINGS

The objects, advantages and features of the electronic drive circuit for a MEMS type resonator device, and the method for actuating the electronic circuit will appear more clearly in the following description made on the basis of at least one non-limiting embodiment, illustrated by the drawings, in which.

DETAILED DESCRIPTION OF THE INVENTION

In the following description, all those electronic elements of the electronic drive circuit directly connected to the resonator of the resonator device, which are well known to those skilled in the art in this technical field, will be described only in a simplified manner. Preferably, the resonator device is a gyroscope with a MEMS type sensor or resonator with a high quality factor. The basic functions of the electronic drive circuit are, on the one hand, to oscillate the mass of the primary resonator, i.e. to oscillate the mass in a determined direction, and to control the mechanical oscillation amplitude of the mass.

Figure 1:
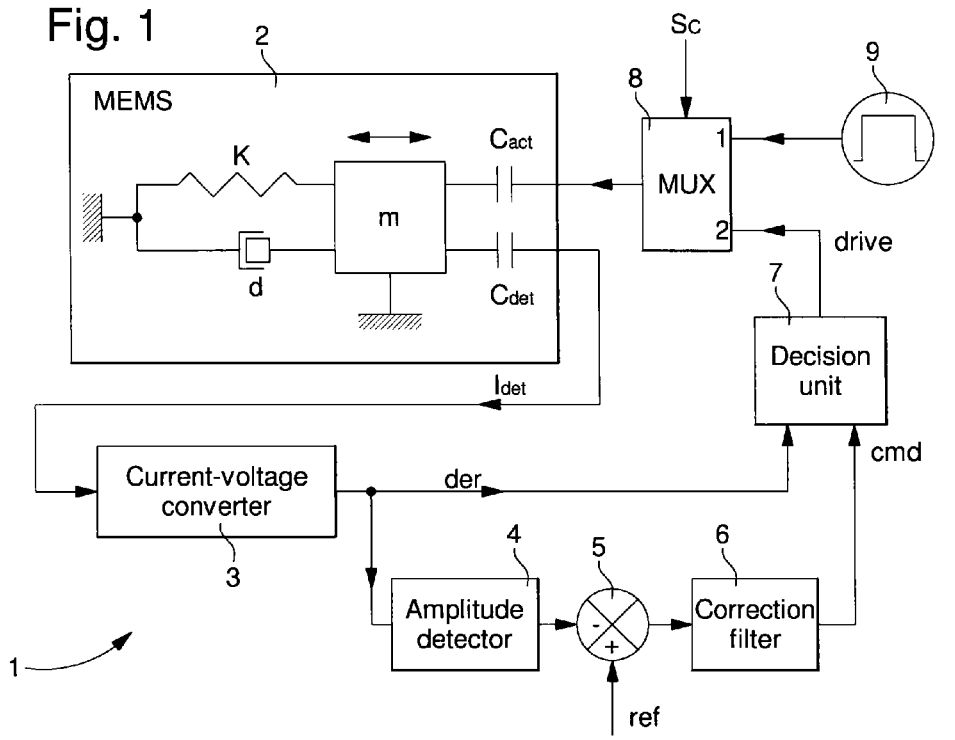
FIG. 1 shows a simplified view of the components of the electronic drive circuit connected to the MEMS type resonator according to the invention.

FIG. 1 shows an embodiment of electronic drive circuit 1 connected to MEMS type resonator 2. Electronic drive circuit 1 on the one hand allows resonator 2 to be actuated via an actuation element $C_{act}$ and on the other hand allows the motion of a mass m of resonator 2 to be detected via a detection element $C_{det}$. Actuation element $C_{act}$ and detection element $C_{det}$ may generally be considered to form part of the components of resonator 2, but they may also be considered to form part of electronic drive circuit 1 of resonator 2. The oscillation amplitude of mass m is adapted in a control loop of the electronic circuit as a function of the motion measurement or detection of mass m.

In addition to electronic drive circuit 1 described in detail below, the MEMS type gyroscope is thus formed of a resonator 2, which is defined as a primary resonator, and of a secondary resonator for measuring the rotational velocity of the gyroscope in one direction or on a determined axis. However, in the present invention, preferably only primary resonator 2 shown in FIG. 1 is considered, since the secondary resonator does not affect the primary resonator or only to a lesser extent.

The rotation of the MEMS type resonator may inject a vibratory energy into the moving mass. However, since the oscillating system of the MEMS type resonator has a natural resonance frequency, and is very selective, the energy supplied outside this frequency band is greatly attenuated. Consequently, the oscillation induced in the mass of the MEMS resonator is very low. The total mass of the gyroscope concerned is assumed to rotate around 2000 degrees per second, i.e. 5 revolutions per second. This corresponds to a frequency of 5 Hz, whereas the MEMS resonator concerned has a bandwidth of around 20 kHz. Since the frequencies concerned are considerably removed from each other, it is possible simply to consider the primary resonator for electronic drive circuit 1.

This resonator 2 may thus include a seismic mass m, which is connected to a spring k, to a damping element d in parallel with the spring, to a detection element $C_{det}$ and to an actuation element $C_{act}$. Applying a voltage across actuation element $C_{act}$ generates an electrostatic attraction force to supply electromechanical power to the seismic assembly formed of mass m with spring k and damping element d. Thus, it is possible to set said mass m in motion by a succession of voltage pulses supplied to the actuation element.

Preferably, the actuation element is an actuation capacitor $C_{act}$ and the detection element is a detection capacitor $C_{det}$, which may be placed in parallel to actuation capacitor $C_{act}$. The electrodes of these two capacitors are arranged in parallel, but without any direct contact. The capacitive value of actuation capacitor $C_{act}$ or detection capacitor $C_{det}$ provides a picture of the position of seismic mass m and enables control to be effected in the electronic drive circuit via detection capacitor $C_{det}$. The primary velocity or force in one direction is thus measured by detection capacitor $C_{det}$. However, the mass is set in motion via actuation capacitor $C_{act}$.

Electronic drive circuit 1 can maintain a defined oscillation amplitude of a seismic mass m. The oscillation frequency of the mass m is dependent on the spring factor k, one end of which is connected to a fixed structure of the gyroscope. Seismic mass m is preferably connected to the earth terminal like the fixed structure. This ensures the proper uncoupling of the two capacitors used for actuating the oscillation of mass m retained by spring k and for detecting the motion of the mass. Preferably, the derivative of the motion of seismic mass m is read.

Electronic drive or control circuit 1 with primary resonator 2 normally forms part of a MEMS gyroscope with a high quality factor for measuring angular rotational velocity such as that of a disc. In the gyroscope, the secondary resonator is also used with another capacitor for measuring velocity in the direction perpendicular to the measured velocity of the primary resonator. This perpendicular direction velocity is obtained as a function of the angular rotational velocity of the gyroscope mass to be determined on a measurement axis.

Electronic drive circuit 1 includes a conversion means 3 connected to a fixed electrode of detection capacitor $C_{det}$. The other electrode of the capacitor is connected to the moving mass, which may be connected to the earth terminal. The distance between the detection capacitor electrodes varies with the motion of the mass. The conversion means makes it possible to perform an electronic analogue reading of the motion of mass m. A variation in the distance I between the electrode fixed to the mass and the fixed position electrode enables a measurement to be performed of the velocity of motion of the mass. The capacitive value of the detection capacitor is given by $C_{det} = \in \cdot S/I$, where the distance I is variable with time, while the surface S of the electrodes facing each other remains constant.

Conversion means 3 is preferably a current-voltage converter 3, which outputs a signal der derivative of the motion of the mass on the basis of a detection current $I_{det}$ from the detection capacitor $C_{det}$. This derivative signal der is generally a sinusoidal voltage signal, whose frequency corresponds to the oscillation frequency of the moving mass. This derivative signal der outputted by converter 3 is supplied in a first branch to a decision unit 7.

The amplitude of derivative signal der must normally be compared to a determined reference or set point amplitude ref. This comparison is performed by a comparison means in decision unit 7 or by a comparison means which is arranged in a second branch between the output of converter 3 and decision unit 7. According to the amplitude level of derivative signal der relative to a reference or set point amplitude ref, decision unit 7 is able to supply an actuation signal drive to a fixed electrode of actuation capacitor $C_{act}$. This actuation signal drive is adapted to maintain the oscillation of the seismic mass at the desired amplitude.

Generally, decision unit 7 acts as a logic unit with the supply of pulsed actuation signals drive for mass m as digital signals. The fixed electrode of the actuation capacitor may receive positive voltage pulses for actuation in accordance with this embodiment, but negative voltage pulses may also be used for actuation. These pulsed signals are described below with reference to FIGS. 4a to 4d and are defined between a low voltage value, for example 0 V, of a supply voltage source (not shown), and a high voltage value, for example the voltage supplied directly by the voltage supply source, which may have a value of between 1.65 V and 3.3 V.

Preferably, electronic drive circuit 1 includes a particular comparison means outside decision unit 7 for comparing the amplitude of derivative signal der to a reference or set point amplitude ref. To achieve this, the derivative signal der is supplied to the input of an amplitude detector 4. This amplitude detector may be a conventional peak detector for detecting, for example, the highest point of derivative signal der, or a rectifier element followed by a low pass filter. A comparator 5 at the output of amplitude detector 4 compares the amplitude of derivative signal der to set point amplitude ref. The derivative signal amplitude is supplied to the negative input of comparator 5, whereas the set point amplitude ref is supplied to the positive input of comparator 5. If the derivative signal amplitude is lower than the set point amplitude, this means that the mass oscillation amplitude must be increased, whereas in the opposite case, the moving mass oscillation amplitude must be decreased.

The comparison signal at the output of comparator 5 must also pass through a correction filter 6 to deliver an amplitude level control signal cmd to decision unit 7. This control signal cmd is higher than the highest point of derivative signal der if the oscillation amplitude of the moving mass has to be increased rapidly. However, this control signal cmd is lower than the lowest point of derivative signal der if the oscillation amplitude of the moving mass has to be rapidly decreased as explained below with reference to FIGS. 4a and 4b. The voltage pulses drive supplied by decision unit 7 to actuation capacitor $C_{act}$ are thus dependent on the comparison between the comparison signal cmd supplied in the second branch and the derivation signal der supplied in the first branch.

Electronic drive circuit 1 further includes a start generator 9, which is used in an initial start phase of electronic circuit 1 of the resonator device. Generator 9 delivers a start signal to actuation capacitor $C_{act}$ via a multiplexer 8 controlled by a switching signal Sc. The other input of the multiplexer receives the actuation signal drive from decision unit 7 but in an initial start phase, switching signal Sc allows start generator 9 to be connected to actuation capacitor $C_{act}$.

The frequency of the start signal for start generator 9 for actuating mass m of resonator 2 is not synchronised with the natural spring frequency. This means that the combination of the actuation start signal and the oscillation signal passes through minimum amplitude (zero) and maximum amplitude due to the phase shift of the signals. This is not of great importance in the present case, since a simple RC oscillator may, for example, be used in generator 9 for generating the actuation start signal. However, another type of oscillator could also be used without feedback on the oscillation amplitude.

After a time determined by a counter (not shown), multiplexer 8 is controlled by switching signal Sc to connect decision unit 7 to actuation capacitor $C_{act}$ to close the oscillation amplitude feedback loop on the basis of a supplied reference value ref. The derivative signal der must have a sufficient level for the signal to be able to be used in the feedback loop, which is why it is necessary to require, at the start, an actuation start signal by start generator 9.

Figure 2:
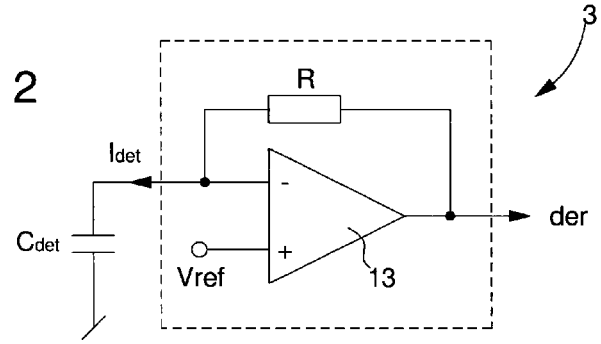
FIG. 2 shows an embodiment of a current-voltage converter of the electronic drive circuit for detecting motion of the resonator mass according to the invention.

FIG. 2 shows an embodiment of the current-voltage converter 3 used for detecting motion of the oscillating mass and supplying the motion derivative signal der. One of the electrodes of detection capacitor $C_{det}$, which is the fixed electrode, is connected to a negative input of an amplifier 13, for example an operational amplifier. The other capacitor electrode, which is the moving electrode connected to seismic mass m, is preferably connected to the earth terminal of the supply voltage source. A reference voltage Vref is supplied to a positive input of amplifier 3. A resistor R connects the negative input of amplifier 3 and the amplifier output, which delivers the derivative signal der. Derivative signal der is thus a sinusoidal voltage signal relative to reference voltage Vref, which defines the common mode voltage of derivative signal der. The signal is also sinusoidal because the MEMS resonator has a high quality factor with a highly selective frequency.

It is to be noted that detection current $I_{det}$ is proportional to the velocity of the seismic mass. This detection current $I_{det}$, which originates from the fixed electrode of the detection capacitor $C_{det}$, is defined by the formula $I = dQ/dt = d(C \cdot V)/dt = C \cdot dV/dt + V \cdot dC/dt = V \cdot dC/dt$ given that, in this case, $C \cdot dV/dt$ becomes close to 0. Thus $V \cdot dC/dt$ represents derivative signal der, since the capacitive value of capacitor $C_{det}$ varies as the distance x between the electrodes varies with the motion of seismic mass m. The distance at rest between the electrodes is $x_0$ et $x = x_0 + \Delta x$ where $\Delta x$ is very small relative to $x_0$, and this properly represents the image of the derivative and thus the linear velocity.

Figure 3:
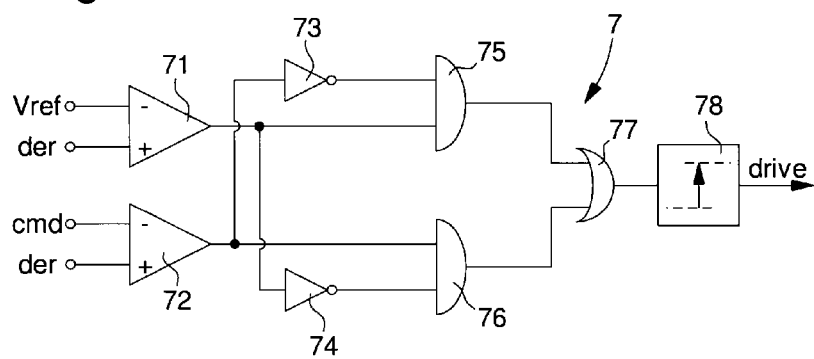
FIG. 3 shows an embodiment of a decision unit of the electronic drive circuit for supplying an actuation signal to an actuation element of the resonator mass according to the invention.

FIG. 3 shows an embodiment of decision unit 7, which represents a logic unit for supplying pulsed signals drive as digital signals. Decision unit 7 first of all includes two amplifiers 71 and 72, which are fast comparators. The output of each comparison amplifier is either at a high level representative of a 1 state, or at a low level representative of a 0 state of a digital signal. The first amplifier 71 receives reference voltage Vref at a negative input and derivative signal der at a positive input. The second amplifier 72 receives amplitude control signal cmd at a negative input and derivative signal der at a positive input. When derivative signal der is higher than reference voltage Vref and control signal cmd, the output of amplifiers 71, 72 is in the 1 state. When derivative signal der is lower than reference voltage Vref and control signal cmd, the output of amplifiers 71, 72 is in the 0 state.

Decision unit 7 further includes a first AND gate 75, which receives the output signal from first amplifier 71 at a first input and the output signal from second amplifier 72 inverted by a first inverter 73 at a second input. Decision unit 7 further includes a second AND gate 76, which receives the output signal from second amplifier 72 at a first input and the output signal from first amplifier 71 inverted by a second inverter 74 at a second input. The output signal from the first AND gate 75 is supplied to a first input of an OR gate 77, whereas the output signal from the second AND gate 76 is supplied to a second input of OR gate 77. The preliminary actuation signal outputted by OR gate 77 may also pass through a voltage booster element 78 to deliver actuation signal drive to the output of decision unit 7, which is a pulsed signal such as a digital signal. The pulses of the actuation signal are arranged according to the level of control signal cmd, and the level of reference voltage Vref in comparison to derivative signal der.

It should be noted that the preliminary actuation signal, which is supplied at the output of OR gate 77 may be immediately used to actuate the actuation capacitor. However, the signal obtained at the output of OR gate 77 must preferably be shifted in level by voltage booster element 78 as a function of the level of the highest supply voltage of the integrated electronic circuit to maximise the energy supplied to the MEMS resonator.

Reference is made to FIGS. 4a to 4d for better comprehension of the operation of the electronic circuit. FIGS. 4a to 4d partially show various signals in time from the detection of motion of the resonator mass by the detection capacitor until the actuation of the actuation capacitor. FIGS. 4a to 4d show various phases for adapting the mass oscillation amplitude prior to maintaining the oscillation of the mass at a determined amplitude. These Figures mainly show the shape of control signal cmd, of derivative signal der referenced relative to reference voltage Vref and the actuation signal drive in various states of adjustment of the oscillation amplitude of the oscillating mass.

It is clear that the control signal cmd changes throughout the adjustment of the oscillation amplitude defined by derivative signal der normally until the system is stable with an adjusted oscillation amplitude. Once the oscillation amplitude has been adjusted on the basis of the desired and programmed set point amplitude ref, control signal cmd is normally located at the level of reference voltage Vref. In these conditions, practically only single pulses remain in the form of Dirac pulses, which are supplied in actuation signal drive to take account also of the damping factor of the spring damping element. This enables the oscillation of the mass to be maintained at a desired amplitude, while considerably reducing the electrical power consumption of the electronic circuit.

Figure 4A:
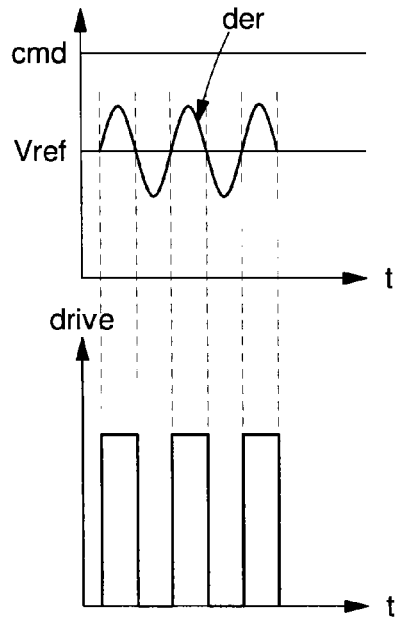
FIGS. 4A to 4d show signal graphs relating to motion detection of the resonator mass and to actuation of the oscillating mass in the electronic drive circuit in the case of maximum actuation power to be supplied or extracted and in the case of intermediate actuation power to be supplied or extracted according to the invention.

FIG. 4a shows the case where the mass oscillation amplitude is well below the desired set point amplitude. In these conditions, control signal cmd is above the highest point of derivative signal der, and thus above reference voltage Vref. On the basis of the decision unit amplifiers and gates, the actuation signal drive delivers rectangular voltage pulses, when derivative signal der is above the reference voltage. Each pulse of signal drive is generated with a width corresponding to the half-cycle positive phase of derivative signal der relative to a defined common mode voltage, which is reference voltage Vref. The half-cycle positive phase corresponds to the positive alternation of derivative signal der.

With control signal cmd above derivative signal der, this means that the mass oscillation amplitude must be increased. To supply energy to the resonator in accordance with FIG. 4a, there must be a positive motion derivative of the mass with time. The force generated in the primary resonator is expressed by the formula $F_{act}=d(E_{act})/dl=\in \cdot S \cdot V^2/(2 \cdot l^2)$ where V is the voltage across the terminals of the actuation capacitor, S is the surface facing the capacitor electrodes, $\in$ is the dielectric constant of the capacitor and l, which is variable, is the distance separating the capacitor electrodes. The actuation energy is thus expressed by the formula $E_{act}=C \cdot V^2/2=\int F_{act} \cdot (dl/dt) \cdot dt=\int F_{act} \cdot dl$. This energy becomes optimum when V is maximum while derivation signal der is positive in the half-cycle above reference voltage Vref and 0 when derivative signal der is negative in the half-cycle below reference voltage Vref.

Figure 4B:
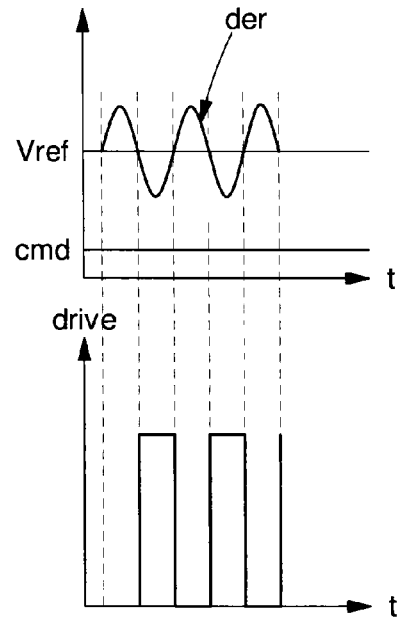

FIG. 4b shows the reverse case where the mass oscillation amplitude is well above the desired set point amplitude. In these conditions, control signal cmd is below the lowest point of derivative signal der, and thus below reference voltage Vref. On the basis of the decision unit amplifiers and gates, the actuation signal drive delivers rectangular voltage pulses, when derivative signal der is below the reference voltage. Each pulse of signal drive is generated with a width corresponding to the half-cycle negative phase of derivative signal der relative to reference voltage Vref. The half-cycle negative phase corresponds to the negative alternation of derivative signal der.

With control signal cmd below derivative signal der, this means that the mass oscillation amplitude must be decreased. To extract energy from the resonator in accordance with FIG. 4b, there must be a negative motion derivative of the mass with time. This energy becomes optimum when V is maximum while derivation signal der is negative in the half-cycle below reference voltage Vref and 0 when derivative signal der is positive in the half-cycle above reference voltage Vref.

Figure 4C:
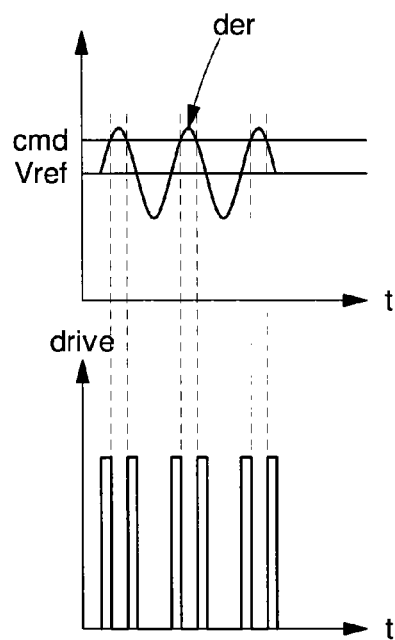

FIG. 4c shows the case where the mass amplitude oscillation is slightly below the desired set point amplitude in an intermediate phase. In these conditions, control signal cmd is between the highest point of derivative signal der and reference voltage Vref. On the basis of the decision unit amplifiers and gates, actuation signal drive delivers two rectangular voltage pulses, when derivative signal der is in the positive half-cycle above reference voltage Vref, but below control signal cmd. When derivative signal der is above control signal cmd, actuation signal drive becomes equal to 0 again. The width of two pulses for each positive half-cycle of derivative signal der decreases as control signal cmd approaches reference voltage Vref corresponding to system oscillation stability.

Figure 4D:
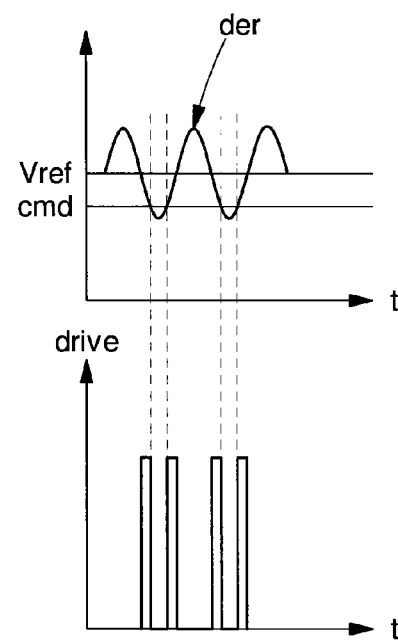

FIG. 4d shows the opposite case to FIG. 4c, where the mass oscillation amplitude is slightly above the desired set point amplitude in an intermediate phase. In these conditions, control signal cmd is between the lowest point of derivative signal der and reference voltage Vref. On the basis of the decision unit amplifiers and gates, actuation signal drive delivers two rectangular voltage pulses, when derivative signal der is in the negative half-cycle below reference voltage Vref, but above control signal cmd. When derivative signal der is below control signal cmd, actuation signal drive becomes equal to 0 again. The width of two pulses for each negative half-cycle of derivative signal der decreases as control signal cmd approaches reference voltage Vref corresponding to system oscillation stability.

As shown in FIGS. 4a to 4d, actuation signal drive includes a series of rectangular pulses arranged either to increase the mass oscillation amplitude, or to decrease said mass oscillation amplitude. Actuation signal drive may be considered a digital signal supplied by a decision unit, which is a logic unit. This differs from any actuation signal of state of the art electronic gyroscope drive circuits, which preferably use sinusoidal signals to adapt the mass oscillation amplitude. Once the oscillation amplitude is at the level of the desired set point amplitude, the pulses of actuation signal drive are of minimum width. The pulses of actuation signal drive are always present to overcome the damping of the spring linked to the oscillating mass.

Generally, the method for actuating the electronic drive circuit of the resonator of the resonator device must first be started by the delivery of a sinusoidal start signal. This start signal is supplied by the start generator as explained above. After a defined duration for setting the mass in oscillation by the start signal, only actuation signal drive is supplied to the actuation capacitor to adapt the mass oscillation amplitude. The feedback loop of the present invention considerably reduces electrical power consumption while guaranteeing a reduced start time and use of a supply voltage in accordance with the integration technology used. The excitation diagram of the electronic circuit is also simplified.

For the electronic drive circuit, it is also possible to envisage phase locking the derivative signal. A phase measurement may thus be performed relative to a reference phase for a digital signal, whose frequency may be selected to optimise system energy efficiency. This means that it is possible to seek to reduce the energy consumed by the electronic circuit, and to phase shift actuation signal drive to obtain phase locking.

It is also to be noted that the resonator and the electronic drive circuit described above are normally arranged for measuring an angular velocity of a gyroscope in one direction or on a defined axis. However, it is entirely possible to envisage using the concept of the electronic circuit with one or more masses for an angular velocity measurement on one, two or three axes with a MEMS type gyroscope with a high quality factor.

From the description that has just been given, several variants of the electronic drive circuit for the resonator of the resonator device and the method of actuating the electronic circuit can be devised by those skilled in the art without departing from the scope of the invention defined by the claims. The detection element may also be a strain gauge. In these conditions, a variable resistive value traversed by a determined current can define the motion of said mass in the electronic circuit.

What is claimed is:

1. An electronic drive circuit for a MEMS type resonator device, the electronic drive circuit being connected to at least one resonator of the resonator device, the resonator including a mass connected to a structure of the device by a spring and a damping element, an actuation element for setting the mass in motion in one direction on the basis of an actuation signal, which is supplied by the electronic circuit, and a detection element for detecting the motion of the mass processed in the electronic circuit to adapt at least one oscillation amplitude level of the moving mass, wherein the electronic drive circuit includes a conversion means connected to the detection element to supply a mathematical derivative signal relating to the oscillation of the moving mass, a comparison means for comparing an amplitude level of the mathematical derivative signal and a defined reference amplitude for supplying an amplitude level control signal, and a decision unit, which is connected to the conversion means and to the comparison means, and which is configured to supply an actuation signal in digital form to the actuation element, said actuation signal being formed of a series of rectangular pulses arranged and determined on the basis of the mathematical derivative signal and of the control signal to increase or decrease or maintain the oscillation amplitude of the moving mass as a function of the defined reference amplitude, wherein the conversion means is a current-voltage converter receiving a detection current from the detection element and supplying the mathematical derivative signal, which is a sinusoidal voltage signal, wherein the detection element is a detection capacitor, whose first electrode is connected to the moving mass and whose second electrode is connected to the current-voltage converter, and wherein the current-voltage converter includes an amplifier a negative input of which is connected to the second electrode of the detection capacitor and a positive electrode receives a reference voltage, a resistor being placed between the negative input and an output of the amplifier, which supplies the mathematical derivative signal in sinusoidal form referenced relative to the reference voltage with a positive alternation above the reference voltage and a negative alternation below the reference voltage.

2. The electronic drive circuit according to claim 1, wherein an output of the conversion means, which supplies the mathematical derivative signal, is immediately connected to the decision unit in a first branch, and wherein the comparison means is arranged in a second branch between the output of the conversion means and the decision unit.

3. The electronic drive circuit according to claim 2, wherein the comparison means includes an amplitude detector, which receives the mathematical derivative signal, and a comparator at the output of the amplitude detector for comparing the amplitude of the mathematical derivative signal to the defined reference amplitude and supplying a level control signal dependent on the comparison between the mathematical derivative signal amplitude and the defined reference amplitude.

4. The electronic drive circuit according to claim 3, wherein the output of the amplitude detector is connected to a negative input of the comparator, whereas a positive input of the comparator receives the defined reference amplitude, so that the level of the control signal supplied by the comparison means is on a positive alternation of the mathematical derivative signal in sinusoidal form, if the oscillation amplitude of the moving mass has to be increased, or in a negative alternation of the mathematical derivative signal, if the oscillation amplitude of the moving mass has to be decreased.

5. The electronic drive circuit according to claim 3, wherein the amplitude detector is a peak detector or a rectifier element followed by a low pass filter.

6. The electronic drive circuit according to claim 3, wherein the comparison means further includes a correction filter connected to an output of the comparator for supplying the amplitude level control signal to the decision unit.

7. The electronic drive circuit according to claim 1, wherein the decision unit is configured to supply a digital actuation signal with rectangular pulses arranged as a function of the comparison between a reference voltage, the mathematical derivative signal in sinusoidal form referenced with respect to the reference voltage, and the amplitude level control signal, if the level of the control signal is above the reference voltage, one or two rectangular pulses are generated by the decision unit for each positive alternation of the mathematical derivative signal, whereas if the level of the control signal is below the reference voltage, one or two rectangular pulses are generated by the decision unit for each negative alternation of the mathematical derivative signal.

8. The electronic drive circuit according to claim 7, wherein the decision unit, which is a logic unit, includes a first input amplifier, which receives a reference voltage at a negative input and the mathematical derivative signal referenced with respect to the reference voltage at a positive input, a second input amplifier, which receives the amplitude level control signal at a negative input and the mathematical derivative signal at a positive input, an output of the first and second amplifiers being in a 1 state, if the mathematical derivative signal is higher than the reference voltage and than the control signal, and in a 0 state if the mathematical derivative signal is lower than the reference voltage and than the control signal,
  wherein the decision unit also includes a first AND gate, which receives the output signal from the first amplifier at a first input and the output signal from the second amplifier inverted by a first inverter at a second input, and a second AND gate which receives the output signal from the second amplifier at a first input, and the output signal from the first amplifier inverted by a second inverter at a second input, and
  wherein the decision unit further includes an OR gate for receiving the output signal from the first AND gate at a first input and the output signal from the second AND gate at a second input, the output of the OR gate being connected to a voltage booster element for supplying the actuation signal at the output of the decision unit.

9. The electronic drive circuit according to claim 1, wherein the circuit includes a start generator connected to a first input of a multiplexer, a second input of the multiplexer being connected to an output of the decision unit, said multiplexer being controlled by a switching signal so as to connect the start generator to the actuation element in an initial actuation phase of the electronic circuit for setting the mass in oscillation, and to connect the decision unit in a subsequent phase after actuation of the electronic circuit.

10. The electronic drive circuit according to claim 9, wherein the start generator is an RC type oscillator for supplying an oscillating start signal to the actuation element, which is an actuation capacitor, a first electrode of which is connected to the moving mass and a second electrode is connected to an output of the multiplexer.

11. A method for actuating the electronic drive circuit of the MEMS type resonator device according to claim 1, the method comprising:
  detecting motion of the moving mass and supplying the mathematical derivative signal via the current-voltage converter connected to the detection capacitor of the resonator;
  comparing the amplitude level of the mathematical derivative signal relative to the reference amplitude to supply the amplitude level control signal;
  controlling the decision unit, which is a logic unit, to supply the actuation signal in digital form to the actuation element, wherein said actuation signal comprises a series of rectangular pulses arranged and determined on the basis of the mathematical derivative signal and of the control signal to increase or decrease or maintain the oscillation amplitude of the moving mass as a function of the defined reference amplitude; and
  repeating the preceding steps in the electronic drive circuit, until the oscillation amplitude of the moving mass is adapted as a function of the defined reference amplitude.

12. The method for actuating the electronic drive circuit of the MEMS type resonator device according to claim 11, wherein in an initial actuation phase of the electronic drive circuit, an oscillating start signal from a start generator is supplied to the actuation element to initiate the oscillation of the moving mass, and wherein in a subsequent phase, the actuation element is actuated by the actuation signal from the decision unit.

13. An electronic drive circuit for a MEMS type resonator device, the electronic drive circuit being connected to at least one resonator of the resonator device, the resonator including a mass connected to a structure of the device by a spring and a damping element, an actuation element for setting the mass in motion in one direction on the basis of an actuation signal, which is supplied by the electronic circuit, and a detection element for detecting the motion of the mass processed in the electronic circuit to adapt at least one oscillation amplitude level of the moving mass,
  wherein the electronic drive circuit includes a conversion means connected to the detection element to supply a mathematical derivative signal relating to the oscillation of the moving mass, a comparison means for comparing an amplitude level of the mathematical derivative signal and a defined reference amplitude for supplying an amplitude level control signal, and a decision unit, which is connected to the conversion means and to the comparison means, and which is configured to supply an actuation signal in digital form to the actuation element, said actuation signal being formed of a series of rectangular pulses arranged and determined on the basis of the mathematical derivative signal and of the control signal to increase or decrease or maintain the oscillation amplitude of the moving mass as a function of the defined reference amplitude,
  wherein an output of the conversion means, which supplies the mathematical derivative signal, is immediately connected to the decision unit in a first branch, and wherein the comparison means is arranged in a second branch between the output of the conversion means and the decision unit,
  wherein the comparison means includes an amplitude detector, which receives the mathematical derivative signal, and a comparator at the output of the amplitude detector for comparing the amplitude of the mathematical derivative signal to the defined reference amplitude and supplying a level control signal dependent on the comparison between the mathematical derivative signal amplitude and the defined reference amplitude, and
  wherein the comparison means further includes a correction filter connected to an output of the comparator for supplying the amplitude level control signal to the decision unit.

14. An electronic drive circuit for a MEMS type resonator device, the electronic drive circuit being connected to at least one resonator of the resonator device, the resonator including a mass connected to a structure of the device by a spring and a damping element, an actuation element for setting the mass in motion in one direction on the basis of an actuation signal, which is supplied by the electronic circuit, and a detection element for detecting the motion of the mass processed in the electronic circuit to adapt at least one oscillation amplitude level of the moving mass, wherein the electronic drive circuit includes a conversion means connected to the detection element to supply a mathematical derivative signal relating to the oscillation of the moving mass, a comparison means for comparing an amplitude level of the mathematical derivative signal and a defined reference amplitude for supplying an amplitude level control signal, and a decision unit, which is connected to the conversion means and to the comparison means, and which is configured to supply an actuation signal in digital form to the actuation element, said actuation signal being formed of a series of rectangular pulses arranged and determined on the basis of the mathematical derivative signal and of the control signal to increase or decrease or maintain the oscillation amplitude of the moving mass as a function of the defined reference amplitude, and wherein the circuit includes a start generator connected to a first input of a multiplexer, a second input of the multiplexer being connected to an output of the decision unit, said multiplexer being controlled by a switching signal so as to connect the start generator to the actuation element in an initial actuation phase of the electronic circuit for setting the mass in oscillation, and to connect the decision unit in a subsequent phase after actuation of the electronic circuit.

15. The electronic drive circuit according to claim 14, wherein the start generator is an RC type oscillator for supplying an oscillating start signal to the actuation element, which is an actuation capacitor, a first electrode of which is connected to the moving mass and a second electrode is connected to an output of the multiplexer.

\* \* \* \* \*

UNITED STATES PATENT AND TRADEMARK OFFICE
CERTIFICATE OF CORRECTION

PATENT NO. : 9,194,703 B2  Page 1 of 1
APPLICATION NO. : 14/242992
DATED : November 24, 2015
INVENTOR(S) : Christophe Entringer et al.

It is certified that error appears in the above-identified patent and that said Letters Patent is hereby corrected as shown below:

On the title page, Item (73), the Assignee's information should read:

-- (73) Assignee: EM Microelectronic-Marin SA, Marin (CH) --

Signed and Sealed this
Fifteenth Day of March, 2016

Michelle K. Lee
*Director of the United States Patent and Trademark Office*